United States Patent [19]

Kriz

[11] Patent Number: 5,023,525

[45] Date of Patent: Jun. 11, 1991

[54] MAGNETIC DEFLECTION CIRCUIT WITH STABILIZED RETRACE

[75] Inventor: J. Stanley Kriz, Fairfax, Va.

[73] Assignee: MegaScan Technology, Inc., Littleton, Mass.

[21] Appl. No.: 504,347

[22] Filed: Apr. 3, 1990

[51] Int. Cl.$^5$ .............................................. G01S 1/16
[52] U.S. Cl. .................................................. 315/408
[58] Field of Search ............... 315/399, 407, 408, 409, 315/410, 320, 321

[56] References Cited

U.S. PATENT DOCUMENTS 4,612,481 9/1986 Storberg ............................. 315/370

OTHER PUBLICATIONS

Component Specification for Semiconductor Diodes, Part No. BY448, BY458, pp. 101-107.

Primary Examiner—Gregory C. Issing
Attorney, Agent, or Firm—Stephen G. Matzuk

[57] ABSTRACT

A deflection circuit for providing magnetic deflection of a cathode ray tube including resonant retrace, including circuitry to minimize the variations in intensity of the image at the beginning of the deflection period after the end of the retrace period, which variation may be caused by parasitic resonances excited by slow turn on of the flyback deflection clamping diode. The circuit enables the flyback clamping diode to begin conduction prior to the end of the retrace period so that the deflection clamping diode is substantially fully conducting and the voltage across the magnetic deflection coil is substantially constant at the end of the retrace period. Thus, a uniform transition is made from retrace to linear deflection and screen intensity variations are avoided.

11 Claims, 2 Drawing Sheets

MAGNETIC DEFLECTION CIRCUIT WITH STABILIZED RETRACE

FIELD OF THE INVENTION

The present invention relates to magnetic deflection circuits, and in particular to high frequency deflection and flyback circuits having a resonant retrace mode.

BACKGROUND OF THE INVENTION

Horizontal deflection circuits as may be used in television and higher speed cathode ray tube (CRT) display devices typically employ high frequency sweep rates, which are most efficiently provided when the deflection or flyback circuit is operated to provide a resonant retrace mode. Accordingly, the deflection coil or flyback inductor is resonated with a selected capacitor to form a circuit wherein the voltage across the deflection or flyback inductor during the retrace interval is a half sine voltage waveform. At the end of the retrace interval, a flyback deflection clamping diode is used to inhibit the voltage polarity reversal, thus causing a flow of current through the inductor to provide the initial portion of the linear deflection. However, the flyback clamping diode typically exhibits a finite turn-on time which causes a delay in the inhibition of the opposite polarity voltage across the deflection coil until the diode becomes fully conductive. The duration required to cause the clamping diode to conduct is typically long enough to cause significant voltage to develop across the diode and short enough to provide a high energy pulse having high frequency components. As the diode begins to conduct, energy of the diode generated voltage pulse is dissipated throughout the deflection circuit. However, the deflection coil typically exhibits a self resonance 10 to 20 time the sweep period, and becomes shock excited by the flyback clamp diode produced pulse. The result of this shock excited self resonance appears as intensity variations in the displayed image. When the circuit is used for horizontal deflection, this intensity variation appears as vertically extending regions or bands of alternating enhanced and reduced intensity for several cycles at the edge of the CRT screen.

Heretofor the suppression of the unwanted high voltage pulse has been addressed by attempting to manufacture a diode having a reduced turn-on time for this application. However, the improvement provided by decreasing turn on times is negated by the trend to increase deflection rates, and the problem persists.

SUMMARY OF THE INVENTION

The magnetic circuit according to the present invention provides stabilized post-retrace deflection intensity by virtually entirely inhibiting the generation of a high energy, high frequency pulse produced by slow turn-on of the flyback clamp diode. According to one embodiment of the present invention, a flow of current is begun through the flyback clamp diode prior to the end of the retrace period, so that the diode is substantially fully conductive when the voltage on the deflection coil is substantially zero at the end of the retrace period. Thus, the present invention provides for the smooth transition between the retrace and the linear deflection by inhibiting the turn on delay induced voltage pulse.

BRIEF DESCRIPTION OF THE DRAWING

These and other features of the present invention will be better understood by reading the following detailed description taken together with the Drawing, wherein.

DETAILED DESCRIPTION OF THE INVENTION

Figure 1:
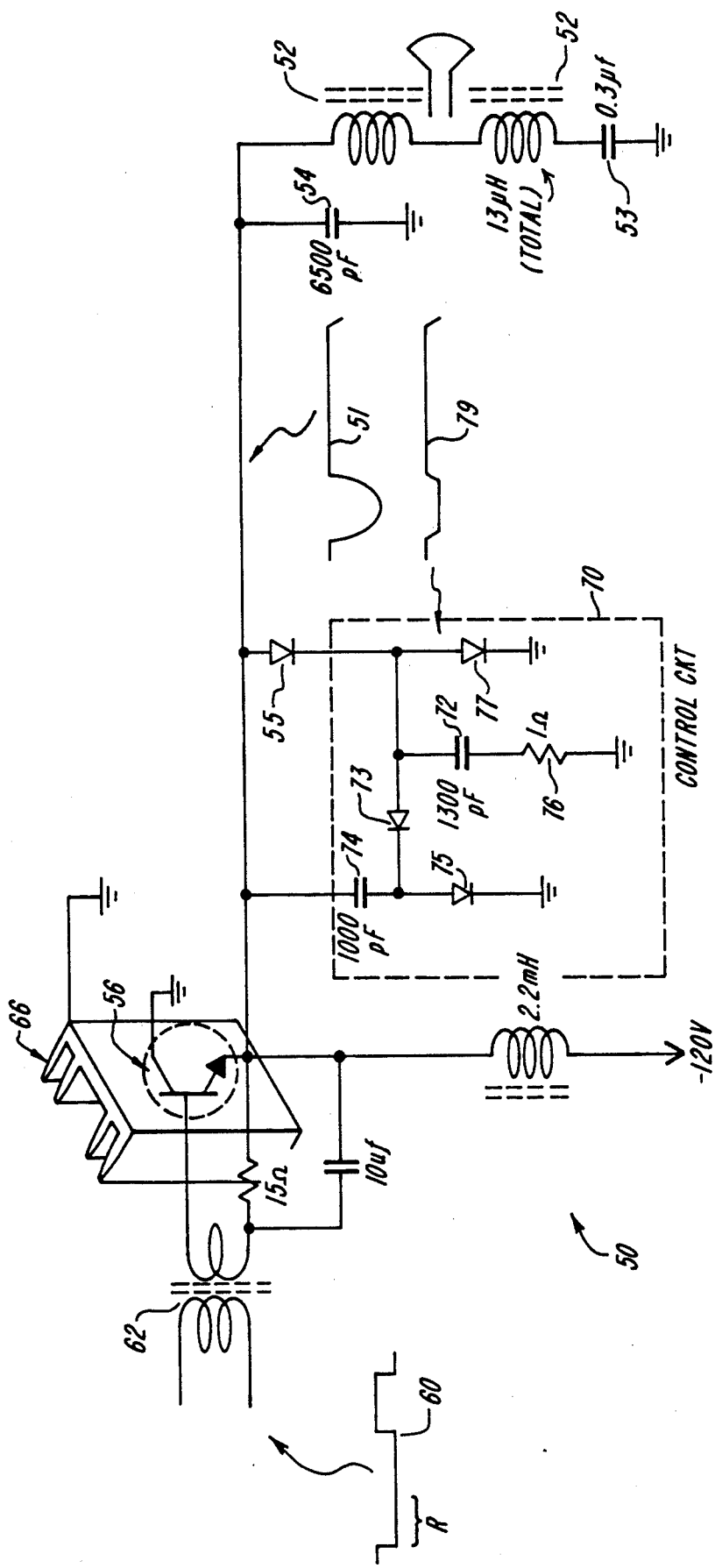
FIG. 1 is schematic diagram of one embodiment of the present invention including representative signal waveforms thereon.

A schematic diagram 50 of one embodiment of the present invention provides a magnetic CRT deflection circuit including a magnetic deflection coil 52 and series capacitor 53, a flyback resonance capacitor 54, flyback clamping diode 55 and an electronic current switch 56 comprising an NPN power transistor. According to the present invention, the conduction of the flyback diode clamp 55 is advanced by the conduction control circuit 70 to begin prior to the end of retrace.

According to the present invention, the current switch 56 is periodically energized with a signal 60 at the deflection sweep rate through an appropriate input coupling transformer 62 or equivalent coupling device to provide a current flow through the emitter and collector of the switch 56. The waveform 51 illustrates the voltage at the diode end of the deflection coil 52, and shows a negative going retrace voltage waveform.

According to another feature of the present invention, the transistor used as the current switch 56 is a metal cased power transistor having a collector connected to the metal case. The grounding of the case (collector) to a conductive (metal) structure 66, such as a heat sink or metal box, as shown in FIG. 1, is permitted as the collector is at the common ground potential of the structure 66, allowing the deflection circuit to be entirely or partially shielded, and thus reducing the radiation of interference (RFI) from high energy, high frequency signals of the deflection circuit.

The flyback diode 55 is turned on in anticipation of the end of the flyback period by adding a small voltage to the flyback retrace voltage. According to the present invention the magnitude of the voltage and onset of the voltage applied to diode 55 corresponds to the particular flyback diode 55 characteristic, and may be selected accordingly. In the present embodiment, diode 55 comprises two type MUR890 diodes connected in parallel; diode 77 comprises type MBR1080, both manufactured by Motorola. The values chosen and shown in the schematic 50 provides the voltage necessary to susbtantially eliminate the voltage pulse induced due to the relatively slow or delayed turn-on of the deflection clamping diode 55. The accelerated turn-on of the deflection clamping diode 55 is provided by the small voltage 79 (40-50 volts) developed across capacitor 72, which when added to the changing voltage provided at the end of the retrace cycle (51) causes the deflection clamping diode 55 to become conductive prior to the end of the retrace period.

The voltage developed across capacitor 72 is provided by diode 73 and capacitor 74 during the onset of the retrace period where the magnitude of the voltage at the diode end of the deflection coil 52 is increasingly negative. The voltage (79) developed across the capacitor 72 is approximately equal to the ratio of the value of the capacitor 74 to the value of the capacitor 72 times the peak voltage at the diode end of the deflection coil 52. After the peak deflection voltage has passed and diminished by a signal magnitude equal to the voltage stored in capacitor 72, diode 75 becomes conductive for the remainder of the retrace cycle, thus capacitor 74 is effectively connected in parallel with the capacitor 54, which determines the retrace resonant frequency. In alternate embodiments of the present invention, capacitors 54, 72 and 74 may be implemented by a plurality of smaller capacitors connected in parallel to provide the desired total capacitance while reducing the inductance typically found in capacitors. Resistor 76 is selected to provide current limiting and to contour the turn-on of the diode 55.

When the current flows through the flyback clamp diode, diode 77 also becomes conductive. Diode 77 is selected to be a high speed Schottky power rectifer having relatively negligeable forward recovery time (<10% diode 55 turn on time). Moreover, according to the present invention, the reverse voltage impressed across the diode 77 is selected to be less than the maximum reverse bias voltage of most Schottky diodes (~50 volts).

Figure 2A:
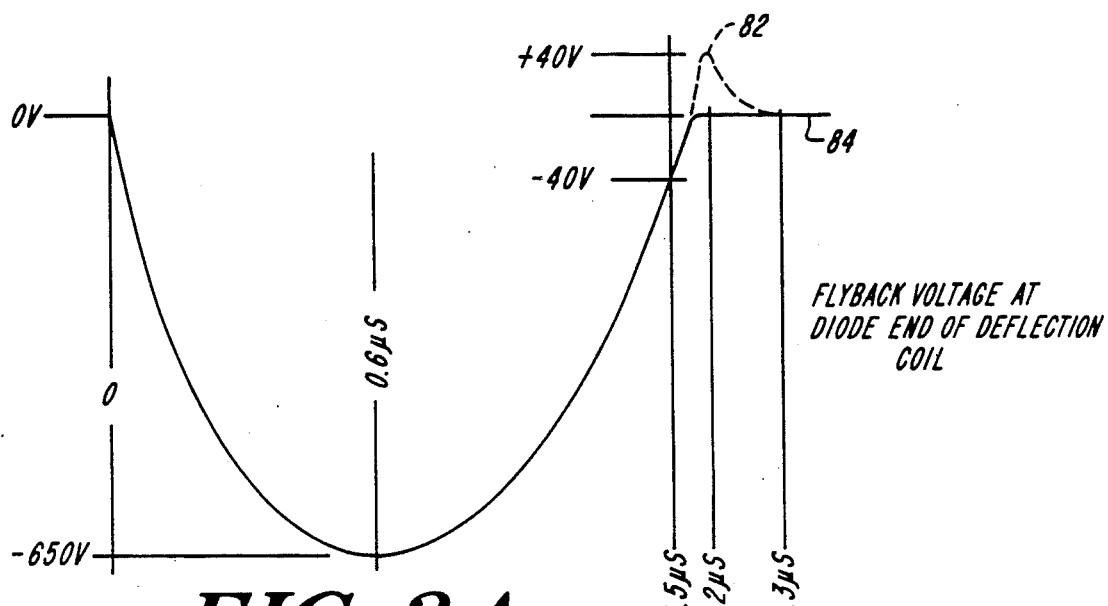
FIG. 2A is a graph of portions of flyback voltage waveforms according to the embodiment of FIG. 1.
Figure 2B:
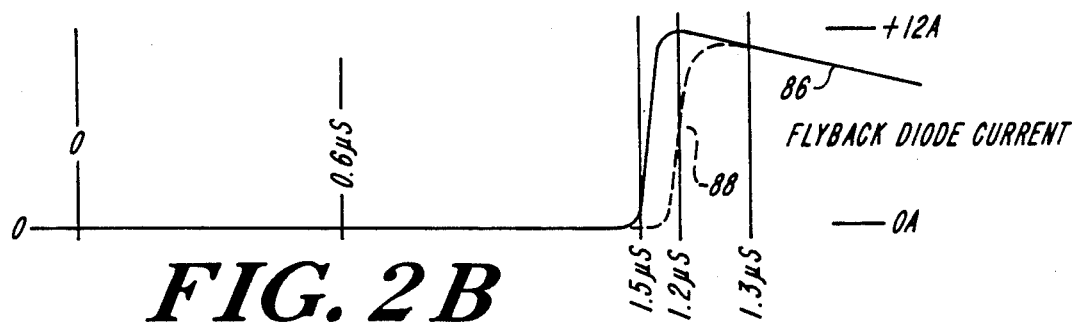
FIG. 2B is a graph of flyback diode current waveforms according to the embodiment of FIG. 1.
Figure 2C:
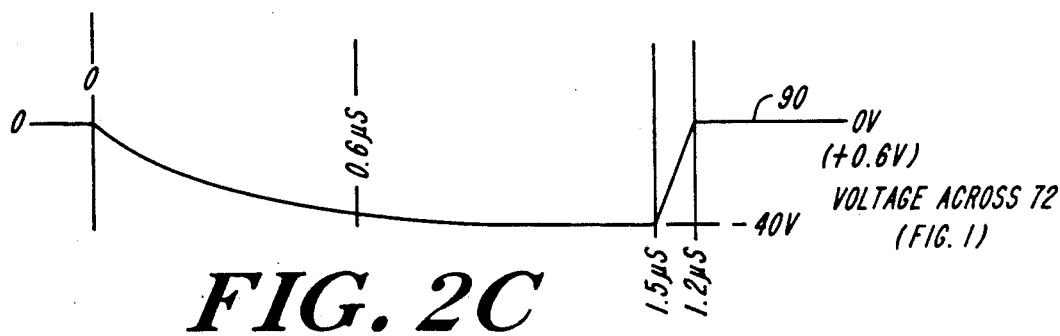
FIG. 2C is a graph of portions of capacitor voltage waveforms according to the embodiment of FIG. 1.

Exemplary voltage and current waveforms are shown in FIG. 2 wherein the flyback voltage at the diode end (51) according to the embodiment of FIG. 1 is shown in more detail 82, in FIG. 2, avoiding the generation of the pulse 82 typically found in prior art designs.

The pulse 82 shock-excites the deflection coil 52 at self-resonant frequencies higher than the sweep rate, producing the previously discussed undesireable intensity variations. The flyback diode 55 current is illustrated by curve 86 which illustrates the onset of diode current prior to the end of the retrace period, in the present embodiment, by 0.05 uS. Typical prior art circuity provides the delayed onset of diode 55 current as illustrated by curve 88.

Finally, the voltage developed across capacitor 72 is illustrated in greater detail by curve 90. The voltage used to cause diode 55 to conduct (~40 volts) is substantially entirely developed during the first half of the retrace period, and maintained until the retrace voltage diminishes to equal the voltage stored on capacitor 72, when the voltage developed on capacitor 72 begins to cause a flow of current through, and forward biasing diode 55. As diode 55 begins to conduct, the energy stored in capacitor 72 is depleted, while the current flow through diode is maintained by the energy from the deflection coil 52.

While the particular embodiment shown relates to deflection circuits, the present invention includes other applications and circuits including resonant flyback periods, such as power supplies. Modification and substitutions of the present invention by one of ordinary skill in the art are considered to be within the scope of the present invention, which is not to be limited except by the claims which follow.

What is claimed is:

1. A deflection circuit, comprising:
a magnetic deflection inductor;
switch means for selectively energizing said magnetic deflection inductor;
a first capacitor connected to said magnetic deflection inductor forming a resonant circuit having a resonant period;
diode means for providing a continued first flow of current in said magnetic deflection inductor at the end of said retrace period; and
conduction control means connected to said diode means, for initiating a second flow of current through said diode means before the end of said retrace period and terminating the second flow of current through said diode means at the end of said retrace period and substantially before said switch means begins to energize said magnetic deflection inductor, wherein the second flow of current through said diode means is absent for at least the majority of the period between the end of said retrace period and the beginning of energization of said magnetic deflection inductor by said switch means.

2. The deflection circuit of claim 1, wherein said conduction control means comprises a voltage source.

3. The deflection circuit of claim 2, wherein said voltage source comprises a second capacitor.

4. The deflection circuit of claim 3, wherein said voltage source further includes a diode connected to said resonant circuit to periodically charge said second capacitor.

5. The deflection circuit of claim 3, wherein said voltage source includes a resistance in series with said second capacitor.

6. The deflection circuit of claim 3, wherein said conduction control means includes a capacitive voltage divider for charging said source from said switch means.

7. A flyback circuit, comprising;
an inductor;
a capacitor connected to said inductor forming a resonant circuit having a resonant frequency;
a switch for periodically energizing said inductor causing a first flow of current therethrough, wherein said inductor resonates with said capacitor at the end of said energization, producing a reverse flow of current through said inductor;
a clamp for inhibiting the continued resonance of said resonant circuit when the voltage at the half cycle period of said resonant circuit is substantially equal to zero volts, wherein said clamp has a finite turn-on time; and
means for initiating the turn-on of said clamp prior to the end of said half cycle period with a second flow of current and for terminating the second flow of current through said clamp at the end of said reverse flow of current through said inductor and substantially before said switch begins to energize said magnetic deflection inductor, wherein the second flow of current through said clamp is absent for at least the majority of the period between the end of said reverse flow of current through said inductor and the beginning of energization of said magnetic deflection inductor by said switch.

8. The flyback circuit of claim 7, wherein said clamp is substantially fully conductive when said voltage of said resonant circuit is substantially constant at the end of said half cycle period.

9. The flyback circuit of claim 8, wherein said clamp comprises a diode.

10. The flyback circuit of claim 9, wherein said means to initiate comprises source means to provide to flow of current through said diode.

11. The deflection circuit of claim 10, wherein said means to initiate the turn-on of said clamp includes a capacitive voltage divider for charging said source from said switch.

* * * * *